US 6,606,489 B2

(12) United States Patent
Razavi et al.

(10) Patent No.: US 6,606,489 B2
(45) Date of Patent: Aug. 12, 2003

(54) DIFFERENTIAL TO SINGLE-ENDED CONVERTER WITH LARGE OUTPUT SWING

(75) Inventors: Behzad Razavi, Los Angeles, CA (US); Pengfei Zhang, Fremont, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 249 days.

(21) Appl. No.: 09/784,735

(22) Filed: Feb. 14, 2001

(65) Prior Publication Data

US 2003/0013419 A1 Jan. 16, 2003

(51) Int. Cl.[7] .................................................. H04B 1/26
(52) U.S. Cl. ....................... 455/323; 455/326; 455/330; 455/333; 327/355
(58) Field of Search ................................. 455/323, 326, 455/330, 333, 127, 91, 572, 573, 115; 327/355, 357, 359; 330/301

(56) References Cited

U.S. PATENT DOCUMENTS

| | | | |
|---|---|---|---|
| 4,612,585 A | | 9/1986 | Takase et al. ................ 358/316 |
| 4,766,497 A | | 8/1988 | Banach et al. ............... 358/188 |
| 4,885,484 A | * | 12/1989 | Gray |
| 4,951,003 A | * | 8/1990 | De Jager et al. |
| 5,635,892 A | | 6/1997 | Ashby et al. ................ 336/200 |
| 5,736,749 A | | 4/1998 | Xie |
| 5,745,838 A | | 4/1998 | Tresness et al. .............. 455/5.1 |
| 6,008,102 A | | 12/1999 | Alford et al. ................ 438/381 |
| 6,031,432 A | | 2/2000 | Schreuders ................ 333/24 R |
| 6,150,852 A | * | 11/2000 | Aparin |
| 6,177,832 B1 | * | 1/2001 | Durec et al. |

OTHER PUBLICATIONS

Lam et al., "A 2.6–GHz/5.2–GHz Frequency Synthesizer in 0.4–μCMOS Technology", *IEEE Journal of Solid–State Circuits*, vol. 35, No. 5, May 2000, pp. 788–794.
Rategh et al., "A CMOS Frequency Synthesizer with an Injection–Locked Frequency Divider for a 5–GHz Wireless LAN Receiver", *IEEE Journal of Solid–State Circuits*, vol. 35, No. 5, May 2000, pp. 780–787.
Samavati et al., "A 5–GHz CMOS Wireless LAN Receiver Front End", *IEEE Journal of Solid–State Circuits*, vol. 35, No. 5, May 2000, pp. 765–772.
Wong et al., "A Wide Turning Range Gated Varactor", *IEEE Journal of Solid–State Circuits*, vol. 35, No. 5, May 2000, pp. 773–779.
Liu T. and Westerwick, E., "5–GHz CMOS Transceiver Front–End Chipset", *IEEE Journal of Solid–State Circuits*, vol. 35, No. 12, Dec. 2000, pp. 1927–1933.
Bautista et al., "A High IIP2 Downconversion Mixer Using Dynamic Matching", *IEEE Journal of Solid–State Circuits*, vol. 35 No. 12, Dec. 2000, pp. 1934–1941.
Steyaert et al., "A 2–V CMOS Cellular Transceiver Front–End", *IEEE Journal of Solid–State Circuits*, vol. 35, No. 12, Dec. 2000, pp. 1895–1907.

* cited by examiner

*Primary Examiner*—Dwayne Bost
*Assistant Examiner*—Huy D Nguyen
(74) *Attorney, Agent, or Firm*—Withrow & Terranova, PLLC

(57) ABSTRACT

A method and apparatus of converting differential signals to single-ended signals. The method includes receiving a differential signal comprising a first current and a second current and applying the second current to a first load to generate a first voltage. A third current is generated in response to the first voltage. The first current is summed with the third current and applied to a second load to generate the single-ended signal.

38 Claims, 8 Drawing Sheets

DIFFERENTIAL TO SINGLE-ENDED CONVERTER WITH LARGE OUTPUT SWING

BACKGROUND OF THE INVENTION

The field of wireless technology is currently undergoing a revolution, and is experiencing exponential growth. Mobile phones, once considered a novelty and referred to as "car phones" are now ubiquitous, and cordless phones in the home are commonplace. A new batch of wireless personal digital assistants, phones, and Bluetooth enabled computer peripherals are now entering the market, with wireless Internet access as a driving force. A differential to single-ended converter for use in wireless transmitters as a driver for power amplifiers is described. This converter has a large output swing, high efficiency, and good linearity.

Wireless devices typically transmit and receive data through the air on high frequency electromagnetic waveforms, though some systems, such as satellite dishes and pagers simply receive, and others merely transmit. Data transmission is begun by encoding the data to be transmitted. This encoded data typically has a data rate of 100 kHz to 100 MHz and is used to modulate a high frequency carrier signal. The carrier signal is often in the 800 MHz to 10 GHz range. The modulated carrier signal is then applied to an antenna for broadcasting. The broadcast signal is referred to as a radio frequency (RF) signal. Reception involves receiving the RF signal on an antenna, and filtering undesired spectral components. The signal is demodulated, filtered again, and decoded.

FIG. 1A is a simplified block diagram of a transmitter portion 100 used in these wireless applications. Included are a mixer 120, power amplifier driver 130, power amplifier (PA) 140, antenna 150, and voltage controlled oscillator (VCO) 160. VCO 160 generates a local oscillator (LO) signal, the frequency of which is referred to as the carrier frequency. This LO signal is applied to mixer 120 which multiples it with the Baseband data signal on line 110. The output of mixer 120 is a differential output. The power amplifier driver 130 provides gain and converts this differential signal to a single-ended signal useful for driving the PA 140. The PA 140 is a single-ended input and output circuit designed to provide output power for driving the antenna 150.

FIG. 1B is a simplified schematic of a conventional differential to single-ended converter, useful as a power amplifier driver. Differential pair M1 170 and M2 180 are driven by an input signal Vin across input terminals 175 and 185. A time varying (AC) signal at Vin modulates the gate-to-source (VGS) voltages of M1 170 and M2 180, thus generating AC currents in their drains. The drain current of M2 is applied across the load R1 190, which generates an output voltage Vout on line 195. This architecture is popular since it is simple and has good bandwidth. But one drawback of these circuits is that half of the potential gain is lost. In this specific example, it is because the current in the drain of M1 170 is shunted to VCC, and does not contribute to the Vout signal. This means that half of the bias current supplied by current source 195 is wasted. Therefore, there is a need to provide a differential to single-ended converter which makes more efficient use of its supply current.

Three key components of a wireless transmitter are the mixer, the power amplifier, and the converter which is connected between them. The mixer and converter are typically on an integrated circuit with other portions of the receive and transmit channels. Often the power amplifier is off-chip, such that a higher bandwidth process, gallium arsenide is an example, may be used. The mixer is usually differential in nature, and is often a Gilbert multiplier, such that a differential current output is available. The power amplifier is typically single-ended voltage in and single-ended voltage out, with the output connected to the antenna. Therefore, the converter needs to convert the differential current signal from the mixer to a single-ended voltage signal for the power amplifier. Also, the converter may need to provide an output signal capable of driving a signal off-chip through the extra capacitance of bond wires, printed circuit board traces, package leads, and the like. Therefore, the converter needs to be a high bandwidth differential current to single-ended voltage output circuit. Transmitter performance is enhanced if the converter has a large output swing and voltage gain.

SUMMARY OF THE INVENTION

Accordingly, embodiments of the present invention provide methods and apparatus for converting differential signals to single-ended signals. One embodiment takes advantage of inductive loads to increase the output swing. Various embodiments use loads, such as resistors and inductors, to convert a first side of a differential current to a voltage. The voltage can then be converter by a transconductor, such as an NMOS or PMOS device, to a current that may be then added to a second side of the differential current. The added currents are then applied across another load, such as a resistor or inductor, to generate an output voltage.

One exemplary method includes receiving a differential signal comprising a first current and a second current and applying the second current to a first load to generate a first voltage. A third current is generated in response to the first voltage. The first current is summed with the third current and applied to a second load to generate the single-ended signal.

A further exemplary embodiment of the present invention provides a transmitter, where the transmitter has a converter circuit with a first terminal and a second terminal. In this converter circuit, the first terminal receives a first current and provides an output voltage, and the second terminal receives a second current. The converter circuit includes a first load, coupled between a third terminal and the second terminal, which is configured to convert the second current to a first voltage. A transconductance is coupled to the second terminal and the first terminal, and is configured to convert the first voltage to a third current. In one embodiment, the third current is phase shifted or inverted relative to and proportional to the first voltage. A second load is coupled between the a fourth terminal and the first terminal and is configured to convert the sum of the first current and the third current to the output voltage.

Yet another embodiment of the present invention provides a converter which includes a first inductor coupled between a first terminal, which receives a first current signal, and a second terminal. A second inductor is coupled between a third terminal, which receives a second current signal, and a fourth terminal. A first transistor is coupled between the third terminal and a fifth terminal, and it has a control electrode coupled to the first terminal. The first current input and the second current input form a differential current signal, and a single-ended voltage output is generated at the third terminal in response to the differential current signal.

A better understanding of the nature and advantages of the present invention may be gained with reference to the following detailed description and the accompanying drawings.

DESCRIPTION OF THE SPECIFIC EMBODIMENTS

Figure 1A:
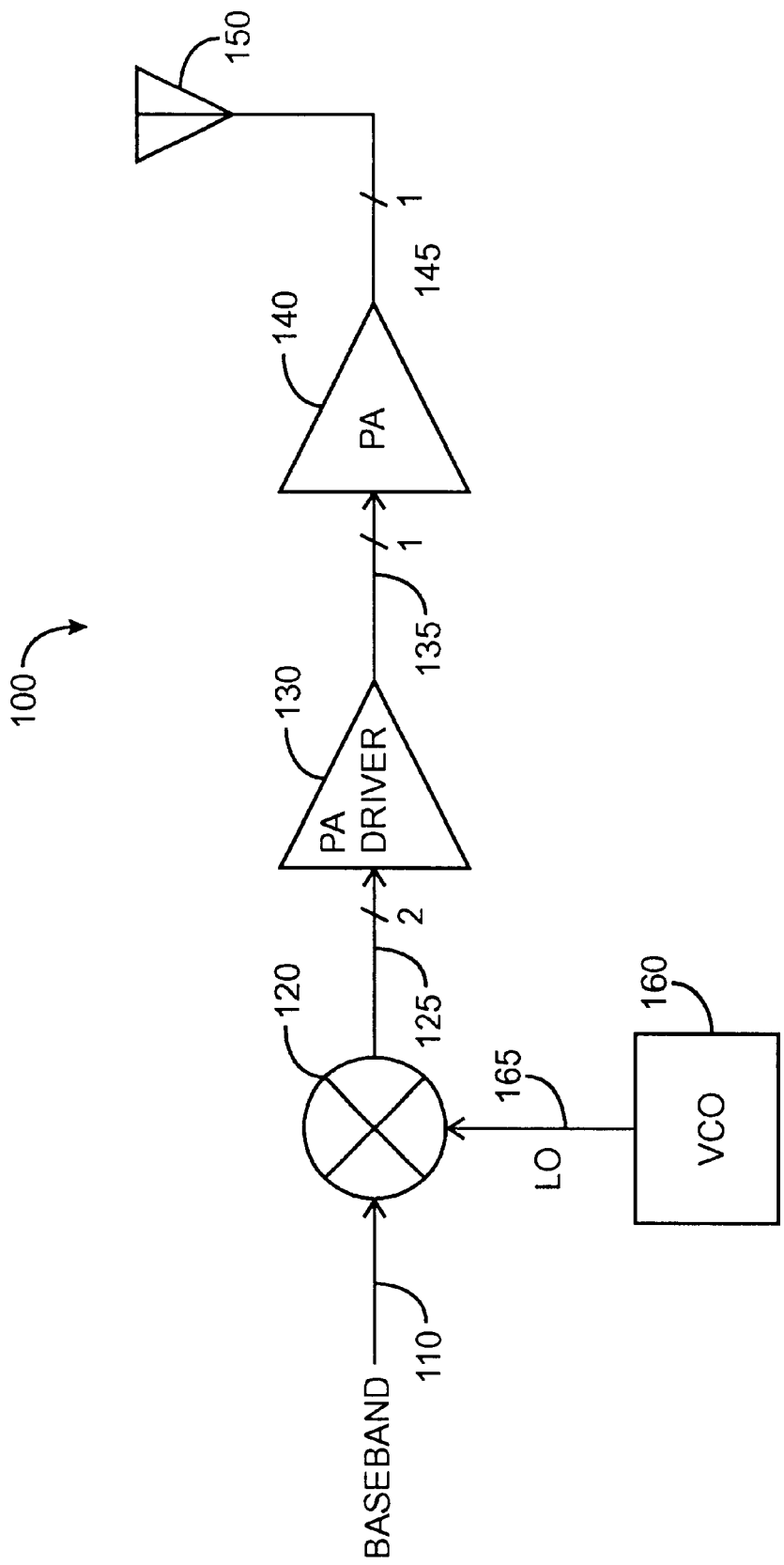
FIG. 1A is a simplified block diagram of an exemplary transmitter for use in wireless devices.
Figure 2:
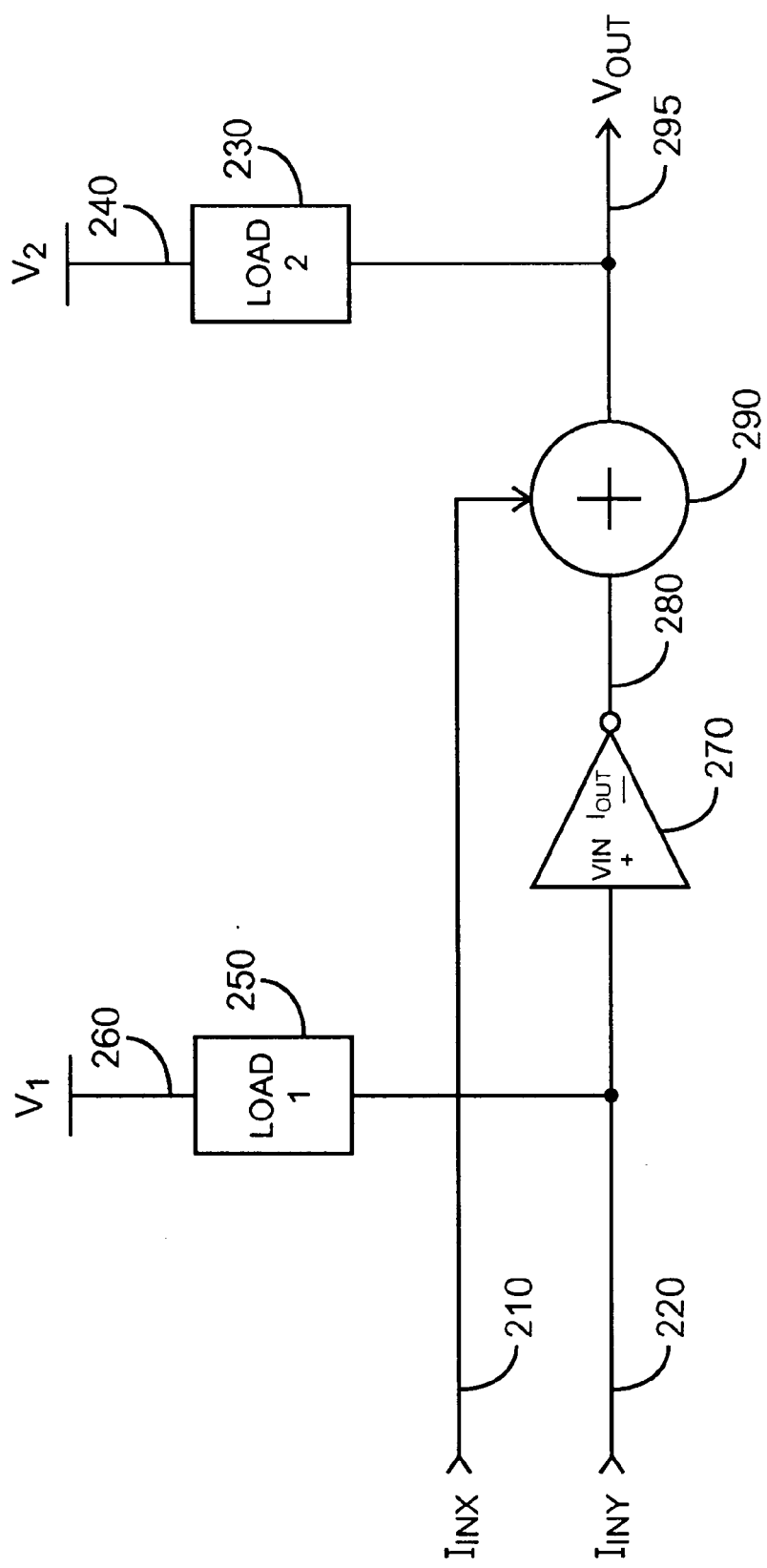
FIG. 2 is a block diagram of a differential to single-ended converter in accordance with one exemplary embodiment of the present invention.

FIG. 2 is a block diagram of a differential to single-ended converter in accordance with one exemplary embodiment of the present invention. This circuit can be used as a converter circuit, or as a converter circuit combined with a power amplifier. Included are a first load 250, a second load 230, transconductance stage 270, and summing junction 290. Iinx is applied on a line 210, and Iiny is applied on a line 220. Iinx and Iiny form a differential current signal, for example the current output from the mixer core in mixer 120 in FIG. 1A. Iinx and Iiny are typically approximately complements of each other, that is as Iinx increases an amount, Iiny decreases that same amount. But they may in some implementations be quite different from each other. For example, Iiny may have a DC or near DC current value, and Iinx may have a value of current that alternates above and below that DC value. Alternately, common mode current components or noise may increase or decrease each current in the same manner, making each less like the complement of the other. Specifically, if a mixer generates these currents, they tend to change in value in opposite directions from each other, but are also modulated together in a common mode fashion. Alternately, these currents may be generated by a polyphase filter.

The first load 250 and the second load 230 may be inductors, for example where Iinx and Iiny are RF current signals. Alternately, they may be resistors, diodes, diode connected NMOS or PMOS (n or p-channel Metal Oxide Semiconductor) devices, current sources, current sources made form pnp transistors, PMOS devices, and the like. When the load 250 and load 230 are inductors, they may be either off-chip, or on-chip. For example, they may be loops or spirals of metal fabricated on the same integrated circuit die as the transconductor 270, and several of the other portions of the transmitter in FIG. 1A.

Transconductor stage 270 may be as simple as a NMOS or PMOS transistor. For example, it may be an NMOS or PMOS transistor in a common-source configuration, or an NMOS or PMOS transistor in a source-follower configuration where the source appears AC grounded at high frequencies. If a source-follower configuration is used, the drain of the device is not tied directly to an AC ground, rather it is connected to an AC ground through an inductor. Alternately, the transconductor may be an inverting amplifier with a current output, an inverting amplifier with a voltage output where the voltage is applied across a resistor to generate a current output, or other such transconductance. For example, a bipolar transistor could be used. A transconductor is a voltage to current converter. A transconductor has a voltage input and a current output. The current output may be linearly proportional to the voltage input, it may be inversely proportional, it may be geometrically proportional, exponentially proportional, or it may be proportional in terms of any other function. For example, the current output may be logarithmically proportional.

The summing junction 290 may be a summing junction, or it may simply be a node where multiple currents are added together. The voltage output VOUT appears as a signal on the line 295, and may be connected to an antenna, power amplifier, power amplifier driver, or it may connect to matching network which in turn connects to an antenna or a power amplifier. Other connections for the input and output are easily envisioned by one familiar in the art, and the above are simply mentioned as illustrative examples, and as with all the examples in this document, do not limit the scope of the claims.

The current signal Iiny on line 220 is applied to the first load 250, which is coupled to a supply V1 on line 260. As the current magnitude of Iiny changes with time, so does the resulting voltage on line 220, which is applied to the transconductor 270. If the first load 250 is an inductor, then the magnitude of the AC component of the voltage on line 220 is equal to $i\omega L$, where i is the AC component of the current Iiny, $\omega$ is 2 times $\pi$ times the frequency of the AC component of the current Iiny, and L is the inductance value.

The AC voltage on line 220 is inverted and converted to a proportional current and output on line 280. This current is then added to the current Iinx on line 210 at summing junction 290. Since currents are being added, summing junction 290 can be as simple as a single node. The summed current is then applied to a second load 230. Again, this load may also be an inductor, in which case the AC voltage output Vout is $i\omega L$, where i is the summed current, $\omega$ is 2 times $\pi$ times the frequency of the AC component of the summed current, and L is the inductance of the second load.

The first load 250 is connected to a voltage V1 on line 260, and the second load 230 is connected to a voltage V2 on line 240. The voltages V1 and V2 may be the same voltage, such as a chip supply or local supply such as VCC. Alternately, they may be different voltages, such as where V1 acts as a bias supply for transconductor 270.

There are two non-ideal phase shift errors which can limit performance of the embodiments of the present invention. One of these is related to the limitations on the frequency response of the active devices used; the other is caused by the voltage and current phase relationship inherent in reactive components.

If transconductor 270 has sufficient bandwidth, it provides a current which is the inversion of its input voltage. But for limited bandwidth circuits, this may not be true. The delay through the transconductance 270 may become significant, with the resulting phase shift being more than 180 degrees. Accordingly, the active device or devices used in transconductor 270 should be carefully designed for biasing, size, and layout in order to increase the bandwidth of the circuit.

If the first load 250 is an ideal inductance, and the transconductance 270 provides no load capacitance, the voltage on line 220 appears to lead the current signal Iiny by 90 degrees. Therefore, in order to bring the third current in line 280 into phase with the first current Iinx, the transconductor should phase shift the voltage signal by 270 degrees. But on integrated circuits using a metal spiral pattern for the inductor, the voltage appears to lead the current signal Iiny by only a few degrees. This is because spiral inductors have a low Q, high series resistance, and large parasitic capacitances. Furthermore, the interconnections between the devices, and the input of the transconductance 270 provide additional capacitance. In some implementations of the present invention the phase shift of the inductor is nominal, and thus a phase shift of only about 180 degrees, a simple inversion, is sufficient in the transconductor 270. This is shown in greater detail with a specific design example below.

Again, the tasks to be done by this circuit are the differential signal to a single-ended signal conversion, as well as providing gain at the high carrier frequencies. To optimize transmitter performance, it is important that this circuit be linear, and in order to provide the maximum gain amount, it is important that the circuit have a large output voltage range.

Figure 3:
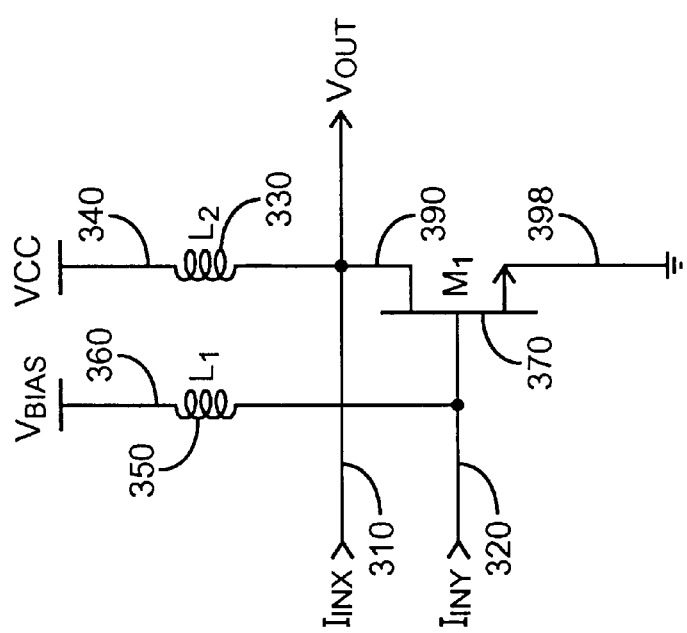
FIG. 3 shows an embodiment of the converter circuit of the present invention that uses a common-source configuration.

FIG. 3 shows one embodiment of the present invention, where both the first and second loads are inductors, and the transconductance is an NMOS device configured as a common-source amplifier. Included are a first inductive load L1 350, a second inductive load L2 330, and NMOS device M1 370. The loads could alternately be resistors, diodes, diode connected NMOS or PMOS devices, current sources, current sources made form pnp transistors, PMOS devices, and the like. NMOS device M1 370 can alternately be a bipolar device, such as an npn, or a gallium arsenide or other type device. For example, M1 370 could be a PMOS device. In that case, the source of M1 370 connects to VCC 340, and the second load L2 430 is connected to ground 398.

A current Iiny is applied on line 320 to inductor L1 350. Inductor L1 is coupled to a bias voltage Vbias on line 360. An AC current component in Iiny causes the voltage on line 320 to swing above and below the voltage Vbias. The average voltage on line 320 is thus Vbias. Since the source of M1 370 is grounded, the average voltage between M1 370's gate and source is Vbias. In this way, Vbias may be adjusted such that M1 370 operates in a linear manner, that is, it operates in its saturation region. The voltage on line 320 is applied to M1 370's gate where it generates a current in M1 370's drain.

At low frequencies this drain current is out of phase, or inverted, with the gate voltage. At very high frequencies, this is no longer true, as the phase delay through the device M1 370 becomes more significant. Therefore, it is important to optimize the size, layout, and biasing of M1 370, to operate well at the frequencies of interest. For example, in one embodiment of the present invention, the phase shift due to bandwidth limitations is a few degrees at most.

Also, as above, if load L1 350 is an inductor, the phase of the voltage on line 320 leads the phase of the current Iiny. But again, due to the low Q and high series resistance of the inductors, as well as large stray capacitances such as the gate capacitance of the transconductance device, this phase shift is also limited and negligible.

The drain current of M1 370 is added to the current Iinx on line 310, and applied to the second inductor L2 330. This results in the generation of the output voltage VOUT on line 310. Inductor L2 330 is coupled to VCC on line 340, so output voltage VOUT swings above and below VCC. Other voltages may be used, for example this circuit may have its own local regulated supply.

One limitation on the output swing is the desired linearity. As VOUT drops to the VGS voltage of M1 370, the device enters the linear or triode region, and its drain current is modulated by its drain voltage, thus distorting VOUT. Ignoring the voltage swing at the gate of device M1 370, the voltage at VOUT should stay approximately higher than the VGS of M1 370, which in this case is Vbias. Since Vout swings above and below VCC, the maximum swing is about 2 times the difference between VCC and Vbias. In some processes, the output swing may be increased by about 400 mV without significant degradation of the circuit's linearity. The exact output swing used depends on the common-mode range of the circuit providing the input, as well as the desired signal linearity, and common-mode input range of the following stage. M1 370 may be a native device to reduce its VGS.

Figure 4:
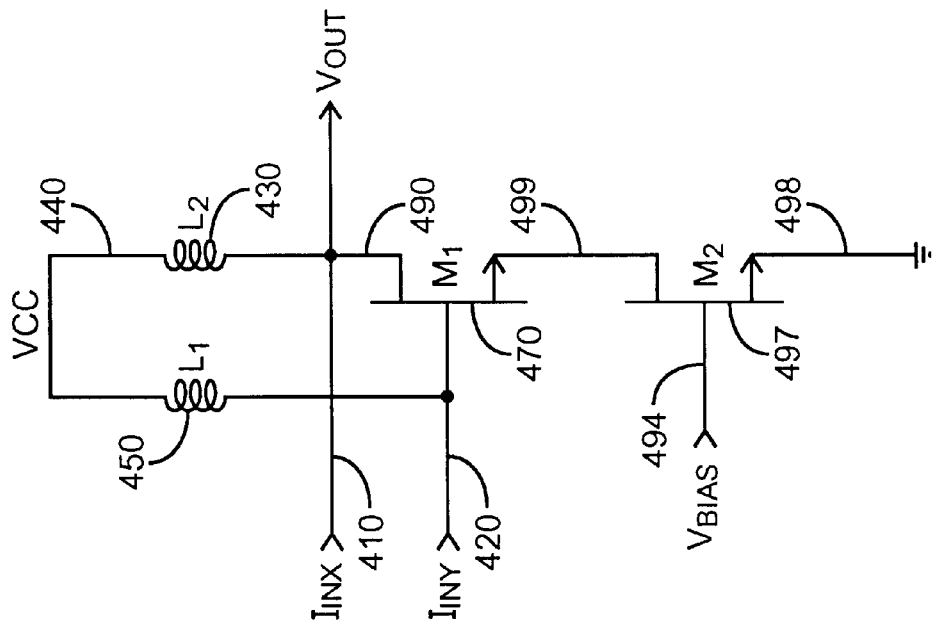
FIG. 4 is a converter circuit consistent with one embodiment of the present invention.

FIG. 4 is a further exemplary embodiment of the present invention. Included are a first inductive load L1 450, a second inductive load L2 430, and a first NMOS device M1 470, and a second NMOS device M2 497. The loads could alternately be resistors, diodes, diode connected NMOS or PMOS devices, current sources, current sources made form pnp transistors, PMOS devices, and the like. NMOS device M1 470 can alternately be a bipolar device, such as an npn, gallium arsenide, or other type device. NMOS device M2 497 may alternately be a bipolar device, such as an npn, or a gallium arsenide or other type device, or it may alternately be a resistor, or a diode connected NMOS or PMOS device. NMOS devices M1 470 and M2 497 may alternately be PMOS devices. In that case, the source of M2 497 is coupled to VCC 440, and the inductors L1 450 and L2 430 connect to ground 498.

A current Iiny is applied on line 420 to inductor L1 450. Inductor L1 450 is coupled to a first supply voltage VCC on line 440. An AC current in Iiny causes the voltage on line 420 to swing above and below the voltage VCC. The average voltage on line 420 is thus VCC. If M1 470 and the current source M2 497 are ideal, the voltage changes at line 420 would not result in a current change at the drain 490 of M1 470. But M1 470 and M2 497 are not ideal. Specifically, there are stray capacitances associated with the interconnect between them. Also, there is capacitance associated with both the source of M1 470 and the drain of M2 497. At very high frequencies, because of these capacitances, the source of M1 appears to be grounded, or connected to ground through a low impedance, and thus high frequency components in the voltage at the gate of M1 470 result in an AC current flow in the drain 490 of M1 470.

At low frequencies this drain current is out of phase, or inverted, with the gate voltage. At very high frequencies, this is no longer true, as the phase delay through the device M1 470 becomes more significant. Therefore, it is important to optimize the size, layout, and biasing of M1 470, to operate well at the frequencies of interest. For example, in one embodiment of the present invention, the phase shift due to bandwidth limitations is a few degrees at most.

Also, as above, if load L1 450 is an inductor, the phase of the voltage on line 420 leads the phase of the current Iiny. But again, due to the low Q and high series resistance of the inductors, as well as large stray capacitances such as the gate capacitance of the transconductance device, this phase shift is also limited and negligible.

The drain current of M1 470 is added to the current Iinx on line 410, and applied to the second inductor L2 430. This results in the generation of the output voltage VOUT on line 410. Inductor L2 430 is coupled to VCC on line 440, so output voltage VOUT swings above and below VCC. Other voltages may be used, for example this circuit may have its own local regulated supply.

VOUT can swing approximately as low as the headroom required for the current source M2 497 to remain linear, plus the VDS of M1 470. As the swing increases further, the current source M2 497 starts to shut off, which correspondingly generates a non-linearity in the output waveform. If the drain voltage of M1 497 drops too far relative to its gate's voltage, the device enters the triode or linear region. In practice, the voltage by which a current source's drain may be lower than its gate is on the order of 200 mV. This number varies for different processes, temperature, and the like. When VOUT is low, the voltage at the gate of M1 470 is high. M1 470 is in the triode region, so its VDS is small, and may also be about 200 mV. Thus, this configuration is capable of having VOUT swing approximately as low as a VGS away from ground. Since VOUT is tied to VCC through an inductor, it swings above and below VCC. Therefore, the maximum swing of VOUT is about 2 times the difference between VCC and the VGS of M1 497. The exact output swing used depends on the common-mode range of the circuit providing the input, as well as the desired signal linearity, and common-mode input range of the following stage. This swing may be maximized by using a native device for M1 470, which reduces its VGS. Furthermore, the body effect of M1 470, which tends to make VGS larger as the source voltage increases, can be reduced or eliminated by tying the bulk connection to the source. But this can only be done if such a connection is possible, such as in a twin-tub process.

Figure 5:
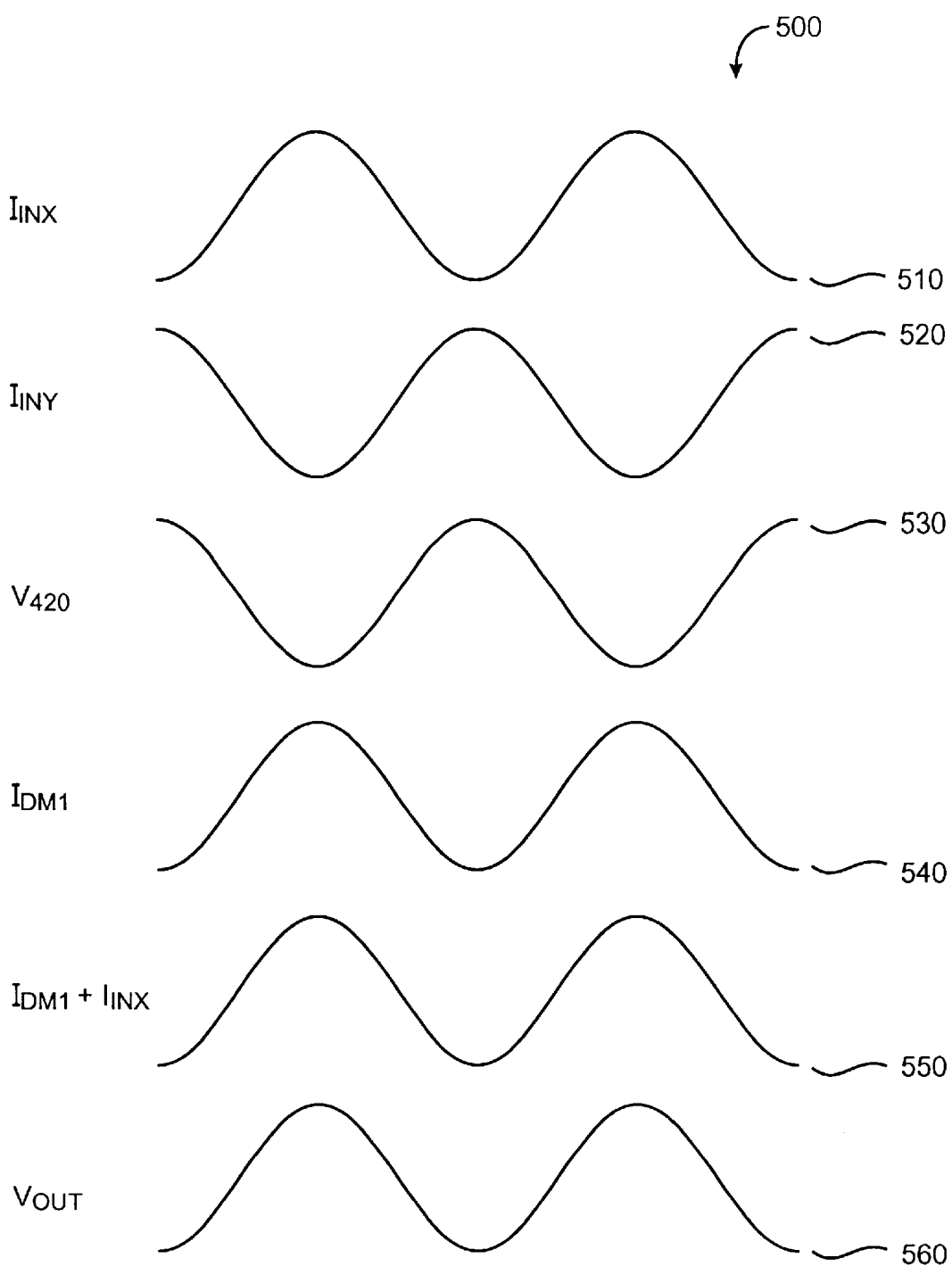
FIG. 5 illustrates some of the voltage and current waveforms for the circuit of FIG. 4.

FIG. 5 is a chart 500 showing some of the various currents and voltages in the circuit of FIG. 4. The amplitudes are not to scale in this chart, and the diagram is intended simply to show phase relationships. Differential currents Iinx and Iiny are shown as complementary sine waves 510 and 520. Iiny applied to inductor L1 450 generates a sinusoidal voltage V420 that is out of phase and ahead of the current waveform. For a current applied to an ideal inductor, the phase shift is 90 degrees. In a typical application this shift is much less. The capacitance at the gate of M1, the low Q, parasitic capacitance and resistance of L1 450, and the stray capacitance of the traces connecting these components on the integrated circuit all act to reduce the phase shift from a right angle. In one embodiment of the present invention, the phase shift is less than a few degrees. For this reason, in this figure, waveform V420 530 is shown as being in phase with waveform Iiny 520.

The voltage at the gate of M1 470, waveform 530, generates a drain current 540 in M1. This is due to the capacitance at the source of M1 470 causing the source to be connected to ground through a low impedance path.

If M1 470 has infinite bandwidth, the current in the drain of M1 470 is 180 degrees out of phase with the voltage at its gate, and would appear as waveform 540. But since M1 470 has limited bandwidth, the phase shift between the drain current of M1 and the voltage at its gate may be more than 180 degrees. In various implementations of the present invention, the shift may be different, and is a function of temperature, processing, supply voltage, and the like. In one implementation of the present invention, the phase angle is very close to 180 degrees.

The drain current of M1 470, waveform 540, and the current Iinx, waveform 510, are added together resulting in waveform 550. This sum is applied to the inductor L2, generating the voltage VOUT 560.

Again, due to the phase shifts caused by the inductive load and bandwidth limitations, waveforms 510 and 530 may be out of phase with each other. When this happens, two undesirable effects occur. First, gain is lost, since waveform 550, the sum of 510 and 540, does not achieve its maximum possible value. Second, spurious harmonics appear at VOUT, since the output waveform is no longer a pure sinusoid. But, since this circuit and any power amplifier following it have limited bandwidth, any harmonics of the carrier are attenuated by the inherent circuit characteristics. Also, matching networks, and filtering which follow this circuit in most implementations reduce these components.

Figure 6:
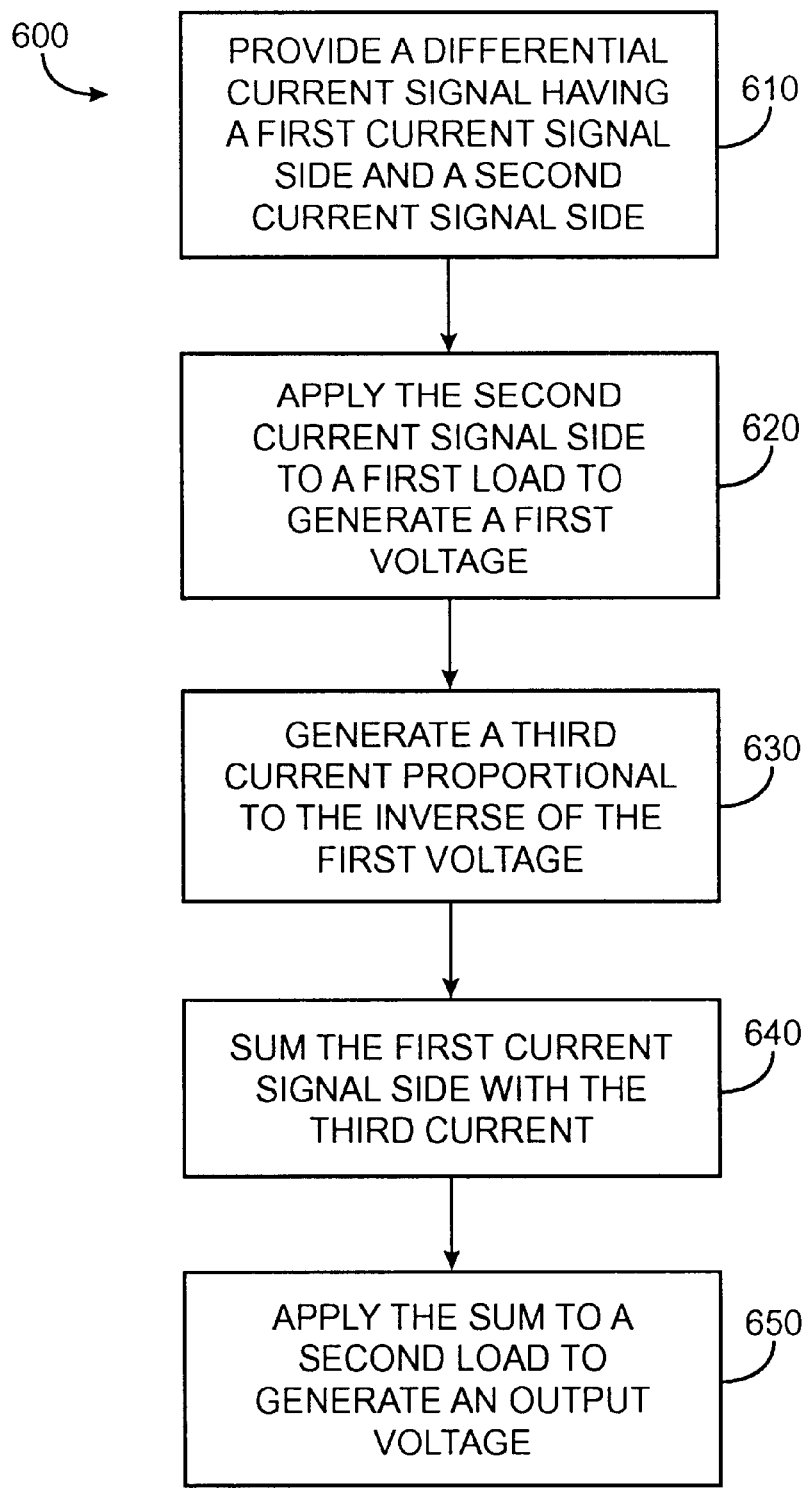
FIG. 6 is a flow chart of the operation of one embodiment of the present invention.

FIG. 6 is a flow chart 600 for a method of converting a differential signal to a single-ended signal in accordance with an embodiment of the present invention. In act 610, a differential current signal having a first current side and a second current side is provided. In act 620, the second current signal side is applied to a first load, thus generating a first voltage. This first voltage is then used to generate a third current proportional to the inverse of the first voltage in act 630. The first current signal side is summed with the third current in act 640. In act 650, the sum of the first current signal side and the third current is applied to a second load, thereby generating a single-ended output voltage.

Figure 7:
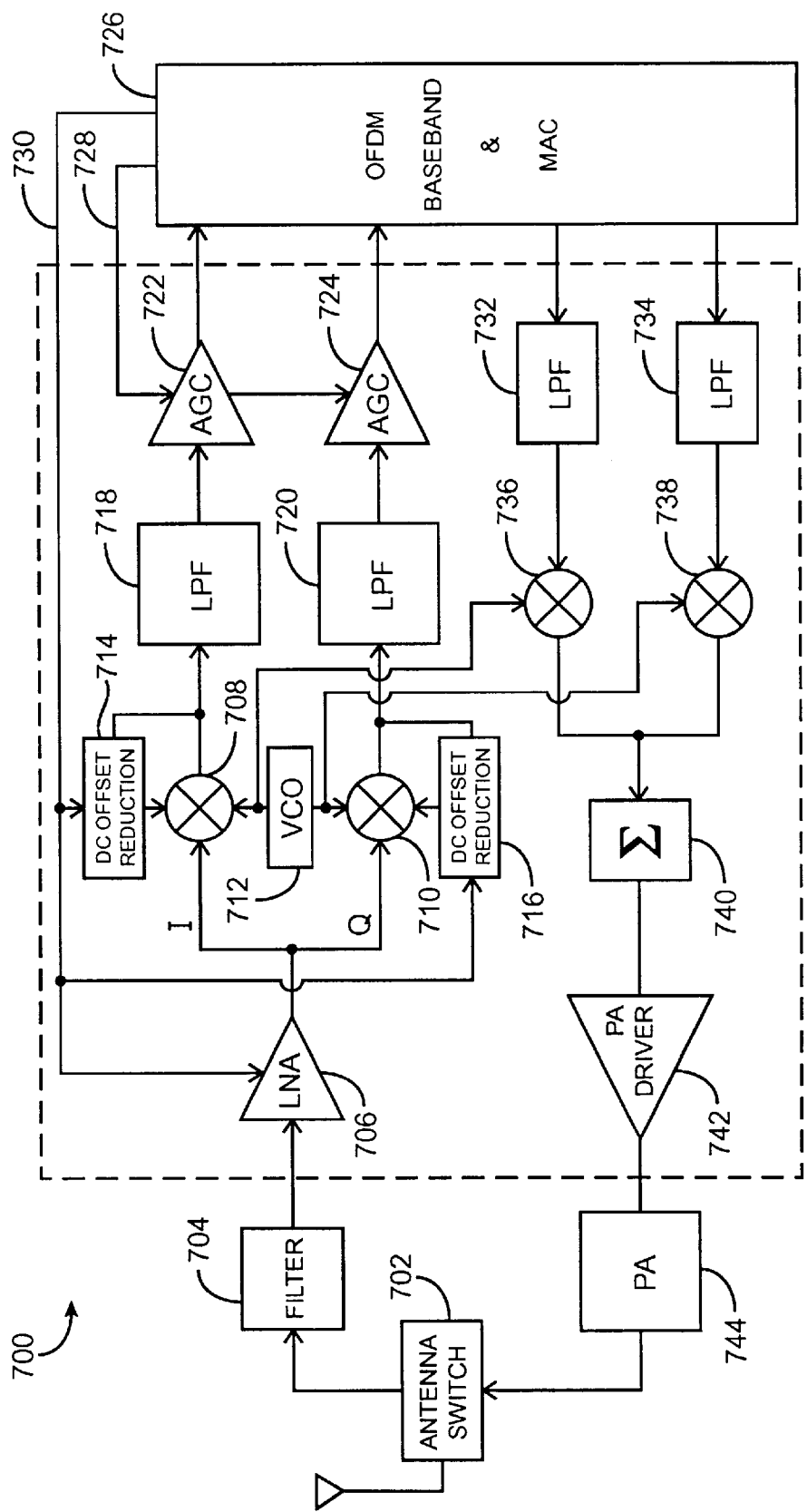
FIG. 7 is a block diagram of an RF transceiver with a differential to single-ended converter in accordance with an embodiment of the present invention.

FIG. 7 is a block diagram of an RF transceiver 700 with a differential to single-ended converter 740 in accordance with an embodiment of the present invention. This block diagram is shown for illustrative purposes only, and does not limit either the possible applications of embodiments of the present invention, or the claims. An antenna switch 702 operates to connect the antenna either to the receiver or the transmitter circuitry of transceiver 700. The receive channel includes a filter 704 that receives the signal from the antenna and operates to reject unwanted signals such as noise from adjacent channels. A low noise amplifier 706 amplifies the signal at the output of filter 704, and supplies it to in-phase (I) and quadrature-phase (Q) down-conversion mixers 708 and 710, respectively. A voltage controlled oscillator 712 generates a pair of local oscillating signals that are 90 degrees out-of-phase with respect to each other. The local oscillating signals are respectively supplied to the I and Q mixers. DC offset reduction circuits 714 and 716 are coupled around mixers 708 and 710. An example of a preferred implementation of such an offset reduction circuit can be found in commonly-assigned patent application Ser. No. 09/768,841, filed Jan. 23, 2001, attorney docket number 20798-001100US, which is incorporated by reference. The I and Q signals are respectively filtered by low pass filters (LPFs) 718 and 720, and the filtered signals are applied to automatic gain control (AGC) circuits 722 and 724. One example of a preferred implementation for LPFs 718 and 720 is described in greater detail in commonly-assigned patent application Ser. No. 09/612,116, titled "Active Circuit having LC Trap Functionality," which is hereby incorporated by reference. The baseband signal processing is performed by block 726 that receives outputs of AGCs 722 and 724 and converts the analog signals to digital signal before processing them using, for example, orthogonal frequency division multiplexing (OFDM). In this embodiment, block 726 also provides media access control (MAC) functionality. The gain adjustment control signals 728 and 730 are provided by block 726. Control signal 728 adjusts the gain of AGCs 722 and 724. Control signal 730 adjusts the gain of LNA 706, DC offset reduction circuits 714 and 716, and, in some embodiments, mixers 708 and 710.

Figure 1B:
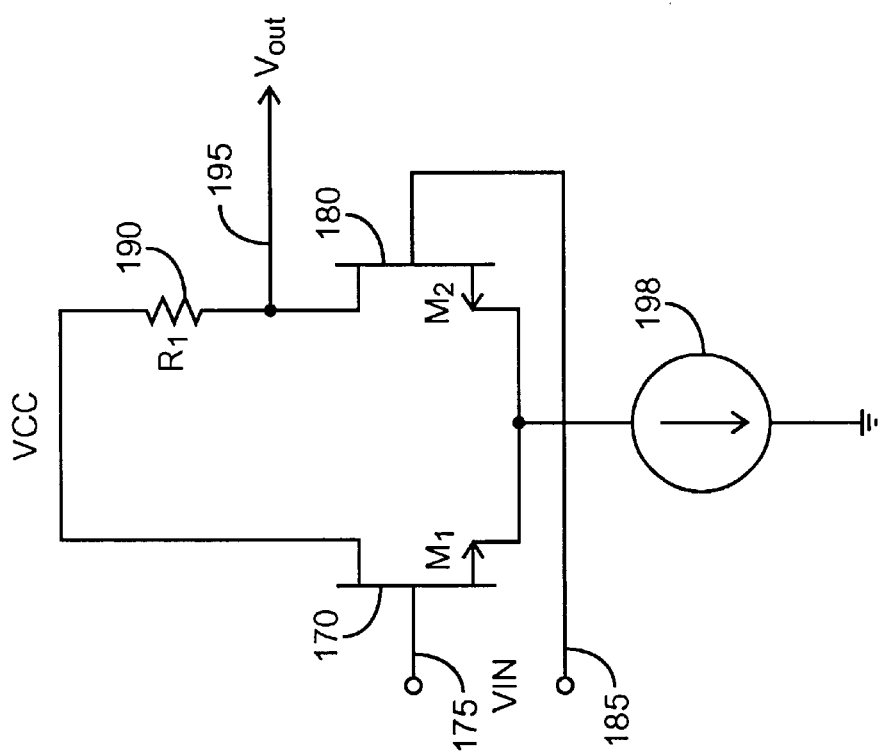
FIG. 1B is a conventional differential to single-ended converter.

The transmit channel includes low pass filters (LPFs) 732 and 734 that receive the I and Q signals and supply them to I and Q up-conversion mixers 736 and 738. In this embodiment, both transmit and receive signals are differential in nature. The up-converter mixers 736 and 738 each receive one of the VCO output signals which are in quadrature. Mixers 736 and 738 combine to form the image reject mixer discussed above with respect to FIG. 1. The outputs of the two up-conversion mixers are combined and applied to a differential to single-ended converter 740. The single-ended output of converter 740 is supplied to a power amplifier driver 742 which drives the input of a power amplifier 744 which is connected to switch 702. In a specific embodiment, this block diagram implements a 5 GHz RF transceiver according to the IEEE 802.11a standard.

Figure 8:
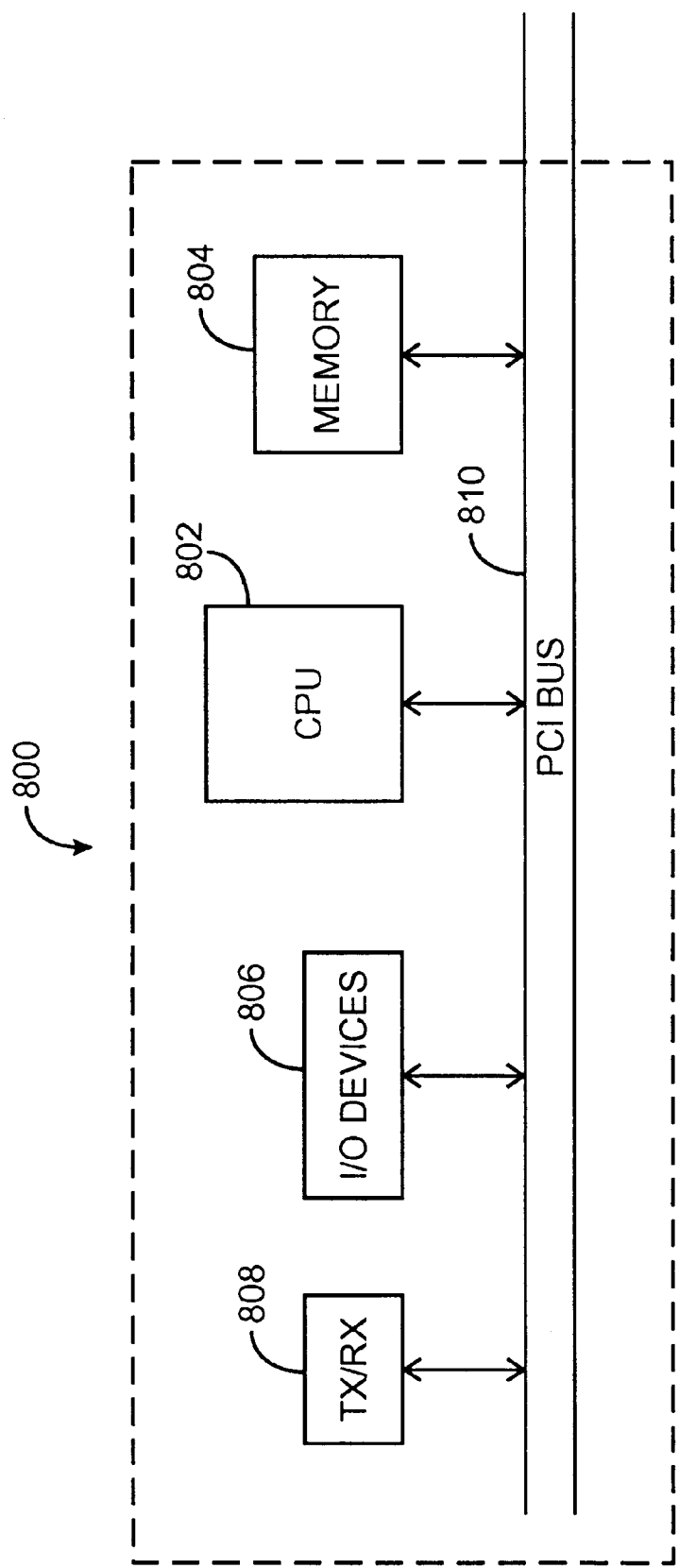
FIG. 8 shows a simplified block diagram for one example of an electronic system having optimized performance according to the present invention.

According to another embodiment of the present invention, the differential to single-ended technique as embodied in the transceiver of FIG. 7 allows for implementation of various electronic systems that are capable of wireless RF communication with optimized performance. Such electronic systems include desktop and laptop personal computers, mobile telephone, television and internet devices, home gateways and media servers, portable digital music devices, data pipes and the like. FIG. 8 shows a simplified block diagram for one example of an electronic system having optimized performance according to the present invention. In this example, a desktop personal computer 800 is used for illustrative purposes. System 800 includes a central processing unit (CPU) 802, memory 804, input/output (I/O) devices 806 and transceiver 808 all coupled to a common personal computer interface (PCI) bus 810. Transceiver 808 may be incorporated into and couple to PCI bus 810 via I/O devices block 806. Transceiver 808 is of the type described above in connection with FIG. 7. Via PCI bus 810, transceiver 808 allows system 800 to wirelessly communicate with other RF wireless devices.

Embodiments of the present invention have been explained with reference to particular examples and figures. Other embodiments will be apparent to those of ordinary skill in the art. Therefore, it is not intended that this invention be limited except as indicated by the claims.

What is claimed is:

1. A method for converting a differential signal to a single-ended signal comprising:

receiving the differential signal comprising a first current and a second current;

applying the second current to a first load to generate a first voltage;

generating a third current in response to the first voltage;

summing the first current with the third current; and applying the sum of the first current and the third current to a second load to generate the single-ended signal.

2. The method of claim 1 wherein the third current is approximately inversely proportional to the first voltage.

3. The method of claim 1 wherein the third current is approximately 180 degrees out of phase with the first voltage.

4. The method of claim 2 wherein the first load comprises a first inductor and the second load comprises a second inductor.

5. The method of claim 2 wherein the first load comprises a first resistance and the second load comprises a second resistance.

6. The method of claim 4 wherein a first NMOS device generates the third current at its drain in response to the first voltage being applied to its gate, wherein the third current is generated due to a capacitance at the first NMOS device's source.

7. The method of claim 4 wherein a PMOS device generates the third current at its drain in response to the first voltage being applied to its gate.

8. The method of claim 6 wherein the first NMOS device is a native device.

9. The method of claim 6 wherein the first NMOS device is formed in a bulk region coupled to a source terminal of the first NMOS device.

10. The method of claim 6 further comprising:

providing a bias current for the first NMOS device.

11. The method of claim 10 wherein the bias current is provided by a second common-source configured NMOS device.

12. A transmitter circuit comprising:

a converter circuit having a first terminal configured to receive a first current and provide an output voltage, and a second terminal configured to receive a second current, the converter circuit comprising:

a first load, coupled between a third terminal and the second terminal, and configured to convert the second current to a first voltage;

a transconductance, coupled to the second terminal and the first terminal, and configured to convert the first voltage to a third current; and a second load, coupled between a fourth terminal and the first terminal, and configured to convert a sum of the first current and the third current to the output voltage.

13. The transmitter of claim 12 wherein the third current is approximately inversely proportional to the first voltage.

14. The transmitter of claim 13 wherein the third terminal and fourth terminal are coupled together and configured to receive a first reference voltage.

15. The transmitter of claim 13 wherein the third terminal is configured to receive a first reference voltage, and the fourth terminal is configured to receive a second reference voltage, the first reference voltage less than the second reference voltage, wherein the first reference voltage is selected so that the transconductor operates in a linear manner during operation.

16. The transmitter of claim 14 wherein the first load comprises a first inductor and the second load comprises a second inductor.

17. The transmitter of claim 14 wherein the first load comprises a first resistance and the second load comprises a second resistance.

18. The transmitter of claim 14 wherein the first load comprises a first inductor, the second load comprises a second inductor, and the transconductance is an NMOS device.

19. The transmitter of claim 14 wherein the first load comprises a first inductor, the second load comprises a second inductor, and the transconductance is a PMOS device.

20. The transmitter of claim 14 further comprising:

a power amplifier having an input terminal coupled to the first terminal of the converter circuit; and a mixer having output terminals coupled to the first terminal and the second terminal of the converter circuit.

21. The transmitter of claim 18 wherein the NMOS device is a native device.

22. The transmitter of claim 18 wherein the NMOS device is formed in a bulk region coupled to a source terminal of the NMOS device.

23. The transmitter of claim 18 wherein the NMOS device is biased by a current source.

24. The transmitter of claim 23 wherein the current source is a common-source configured NMOS device.

25. A transceiver comprising:
a receiver circuit coupled to a transmitter, the transmitter comprising:
a converter circuit having a first terminal configured to receive a first current and provide an output voltage and a second terminal configured to receive a second current, the converter circuit comprising:
a first load, coupled between a third terminal and the second terminal, and configured to convert the second current to a first voltage;
a transconductance, coupled to the second terminal and the first terminal, and configured to convert the first voltage to a third current; and
a second load, coupled between a fourth terminal and the first terminal and configured to convert a sum of the first current and the third current to the output voltage;
a power amplifier having an input terminal coupled to the first terminal of the converter circuit; and
a mixer having output terminals coupled to the first terminal and the second terminal of the converter circuit,
wherein the third current is approximately inversely proportional to the first voltage, and
wherein the third terminal and fourth terminal are coupled together and configured to receive a first reference voltage.

26. An electronic system comprising a transceiver coupled to an interface bus, the electronic system being capable of wireless data communication with another electronic system via the transceiver, the transceiver comprising:
a receiver circuit coupled to a transmitter, the transmitter comprising:
a converter circuit having a first terminal configured to receive a first current and provide an output voltage, and a second terminal configured to receive a second current, the converter circuit comprising:
a first load, coupled between a third terminal and the second terminal, and configured to convert the second current to a first voltage;
a transconductance, coupled to the second terminal and the first terminal, and configured to convert the first voltage to a third current; and
a second load, coupled between a fourth terminal and the first terminal, and configured to convert a sum of the first current and the third current to the output voltage;
a power amplifier having an input terminal coupled to the first terminal of the converter circuit; and
a mixer having output terminals coupled to the first terminal and the second terminal of the converter circuit,
wherein the third current is approximately inversely proportional to the first voltage, and
wherein the third terminal and fourth terminal are coupled together and configured to receive a first reference voltage.

27. A converter circuit comprising:
a first inductor coupled between a first terminal receiving a first current signal and a second terminal;
a second inductor coupled between a third terminal receiving a second current signal and a fourth terminal; and
a first transistor coupled between the third terminal and a fifth terminal, having a control electrode coupled to the first terminal,
wherein the first current signal and the second current signal form a differential current signal, and a single-ended voltage output is generated at the third terminal in response to the differential current signal.

28. The converter circuit of claim 27 further comprising:
a current source coupled to the fifth terminal.

29. The converter circuit of claim 28 wherein the second terminal receives a first reference voltage, and the fourth terminal is coupled to the second terminal.

30. The converter circuit of claim 29 wherein the transistor is an NMOS device.

31. The converter circuit of claim 30 wherein the NMOS device is a native device.

32. The converter circuit of claim 27 wherein the fifth terminal is coupled to a first reference voltage.

33. The converter circuit of claim 32 wherein the second terminal receives a second reference voltage, and the fourth terminal receives a third reference voltage.

34. A transmitter comprising:
a converter circuit comprising:
a first inductor coupled between a first terminal receiving a first current signal and a second terminal;
a second inductor coupled between a third terminal receiving a second current signal and fourth terminal;
a first transistor coupled between the third terminal and a fifth terminal, having a control electrode coupled to the first terminal; and
a current source coupled to the fifth terminal,
wherein the first current signal and the second current signal form a differential current signal, and a single-ended voltage output is generated at the third terminal in response to differential current signal, and
wherein the second terminal receives a first reference voltage, and the fourth terminal is coupled to the second terminal;
a power amplifier coupled to the third terminal of the converter circuit; and
a mixer coupled to the first terminal and the third terminal of the converter circuit.

35. A transceiver comprising a transmitter coupled to a receiver circuit, the transmitter comprising:
a convert circuit comprising:
a first inductor coupled between a first terminal receiving a first current signal and a woo terminal;
a second inductor coupled between a third terminal receiving a second current signal and a fourth terminal;
a first transistor coupled between the third terminal and a fifth terminal, having a control electrode coupled to the first terminal; and
a current source coupled to the fifth terminal,
wherein the first current signal and the second current signal form a differential current signal, and a single-ended voltage output is generated at the third terminal in response to th differential current signal, and
wherein the second terminal receives a first reference voltage, and the fourth terminal is coupled to the second terminal;
a power amplifier coupled to the third terminal of the converter circuit; and
a mixer coupled to the first terminal and the third terminal of the converter circuit.

36. An electronic system comprising a transceiver coupled to an interface bus, the electronic system being capable of wireless data communication with aria electronic system via the transceiver, the transceiver comprising:
a converter circuit comprising:
  a first inductor coupled between a first terminal receiving a first current signal and a sec terminal;
  a second inductor coupled between a third terminal receiving a second current signal and a fourth terminal;
  a first transistor coupled between the third terminal and a fifth terminal, having a control electrode coupled to the first terminal; and
  a current source coupled to the fifth terminal,
  wherein the first current signal and the second current signal form a different current signal and a single-ended voltage output is generated at the third terminal in response to the differential current signal, and
  wherein the second terminal receives a first reference voltage, and the fourth terminal is coupled to the second terminal;
a power amplifier coupled to the third terminal of the converter circuit; and
a mixer coupled to the first terminal and the third terminal of the converter circuit.

37. The electronic system of claim 36 wherein the electronic system is a personal computer.

38. The electronic system of claim 37 wherein the personal computer further comprises a central processing unit (CPU), memory and I/O devices coupled to the interface bus.

* * * * *